(12) United States Patent
Chen et al.

(10) Patent No.: US 9,960,781 B1
(45) Date of Patent: May 1, 2018

(54) CURRENT MODE ANALOG-TO-DIGITAL CONVERTER (ADC)

(71) Applicant: Rockwell Collins, Inc., Cedar Rapids, IA (US)

(72) Inventors: Wenlu Chen, Clarksville, MD (US); Han Chi Hsieh, Gaithersburg, MD (US); Raymond Zanoni, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days. days.

(21) Appl. No.: 15/405,100

(22) Filed: Jan. 12, 2017

(51) Int. Cl.
 *H03M 1/10* (2006.01)
 *H03M 1/12* (2006.01)
 *H03M 1/38* (2006.01)

(52) U.S. Cl.
 CPC ........... *H03M 1/121* (2013.01); *H03M 1/124* (2013.01); *H03M 1/38* (2013.01)

(58) Field of Classification Search
 CPC ......... H03M 1/121; H03M 1/38; H03M 1/124
 USPC .......................... 341/161, 155, 163, 159, 172
 See application file for complete search history.

(56) References Cited

U.S. PATENT DOCUMENTS

| | | | |
|---|---|---|---|
| 7,187,909 B2 | 3/2007 | Lin et al. | |
| 7,902,917 B2 | 3/2011 | Mirzaei et al. | |
| 8,269,660 B2 | 9/2012 | Van Veldhoven | |
| 2008/0191923 A1* | 8/2008 | Maskou | H03M 1/42 341/172 |
| 2012/0213531 A1* | 8/2012 | Nazarathy | H03M 1/145 398/202 |
| 2016/0013804 A1* | 1/2016 | Peluso | G01R 19/16566 341/164 |

* cited by examiner

*Primary Examiner* — Peguy Jean Pierre
(74) *Attorney, Agent, or Firm* — Angel N. Gerdzhikov; Donna P. Suchy; Daniel M. Barbieri

(57) ABSTRACT

A current-mode analog-digital conversion (ADC) circuit directly samples and digitizes an input signal in the current domain; the input signal may be a current signal or a photonic signal. Input capacitors may be coupled to the current source by a series of switches and configured to store a target charge. The target charge may be compared to a reference voltage by comparators of the system to generate digital output. The current-mode ADC circuit may be adapted to flash, successive-approximation, and pipeline architectures, or embodied in a photonic receiver incorporating current-mode ADC circuits configured to sample and digitize photonic signals.

20 Claims, 9 Drawing Sheets

CURRENT MODE ANALOG-TO-DIGITAL CONVERTER (ADC)

BACKGROUND

An analog-to-digital converter (ADC) may be defined by its bandwidth and by its resolution or signal-to-noise ratio (SNR). Traditional ADC designs are voltage-mode based, digitizing an input signal in the voltage domain. The bandwidth of an ADC may be improved by reducing input capacitance, as direct charging to within half of a least significant bit (LSB) may be difficult at higher input capacitances. Similarly, the accuracy and speed of an ADC may be adversely affected by repeated charges to a higher capacitance, as additional time may be required for the charge to release or settle. However, while reduced input capacitance may allow for increased bandwidth in a voltage-mode ADC, reducing input capacitance may still constrain performance by leading to a reduction in SNR. Some photonic ADC (pADC) systems may convert a modulated optical pulse (e.g., a stream of photons) into a current signal, but this current-mode output must still be converted to a voltage-domain ADC input subject to the same constraints.

SUMMARY

In one aspect, embodiments of the inventive concepts disclosed herein are directed to a current-mode analog-digital conversion (ADC) circuit. The current-mode ADC may include input capacitors configured to store a target charge by sampling an input signal in the current domain. The current-mode ADC may include comparators for generating digital output by comparing reference voltages to a target voltage corresponding to the target charge in the input capacitors. The current-mode ADC may include a switch for releasing the target charge on the input capacitors.

In a further aspect, embodiments of the inventive concepts disclosed herein are directed to a photonic receiver. The receiver may include a mode-locked laser or other optical pulse source for generating optical pulses, and a phase modulator for modulating the optical pulses according to received analog input signals. The receiver may include quantizing circuitry for demodulating the optical pulses, and current-mode ADC circuits for generating digital output by sampling the demodulated optical pulses. The receiver may include signal processors for recovering digital output signals based on the digital output of the current-mode ADCs or for further processing the digital output.

In a still further aspect, embodiments of the inventive concepts disclosed herein are directed to a method for current-mode analog to digital conversion. The method may include storing a target charge to input capacitors of a current-mode ADC circuit by sampling, in the current domain, an input signal received from a current source. The method may include generating, via comparators of the ADC circuit, digital output by comparing reference voltages to the target voltage corresponding to the target charge. The method may include releasing the target charge on the input capacitors by closing a switch.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
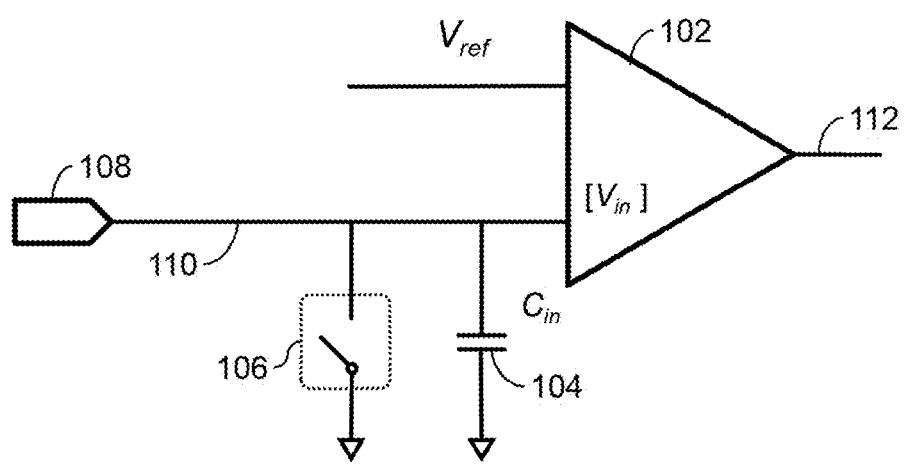
FIG. 1 illustrates an exemplary embodiment of a current-mode analog-digital converter (ADC) architecture according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following:

A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and related methods for analog-to-digital conversion (ADC) in the current domain. By sampling and digitizing input signals in the current domain rather than in the voltage domain, the need for current-to-voltage conversion is eliminated, enabling seamless integration with photonic applications. In addition, input capacitance may be significantly reduced, improving the overall signal/noise ratio (SNR) as well as the bandwidth capability of the embodying receiver.

Referring to FIG. 1, an exemplary embodiment of a current-mode analog-digital converter architecture (ADC) 100 according to the inventive concepts disclosed herein may include a comparator 102, an input capacitor 104 having an input capacitance $C_{in}$, and a reset switch 106 connecting the comparator 102 and input capacitor 104 to a current source 108. While the current-mode ADC architecture 100 shown by FIG. 1 represents a basic single-bit implementation, a current-mode ADC architecture capable of generating a multiple-bit digital output may be constructed from the components disclosed herein.

The current source 108 may provide an input current 110 to be sampled in the current domain (e.g., rather than converted into the voltage domain). For example, the input capacitor 104 may be charged by sampling the input current 110. As the voltage across the input capacitor 104 is a function of the charge Q stored therein and the input capacitance Cin (Vin=Q/Cin), the target voltage associated with the charge Q may be determined and compared, via the comparator 102, to a reference voltage Vref (e.g., is the target voltage Vin greater, or lesser, than the reference voltage Vref). The comparator 102 may quantize the result of this comparison into a digital output 112 (e.g., logic-one if Vin<Vref, logic-zero if Vin>Vref). The charge Q on the input capacitor 104 may be released by closing the reset switch 106, and the next sample received as described above. The comparator 102 may be a photonic comparator configured to receive a photonic input signal (110) such as an optical pulse.

Figure 2A:
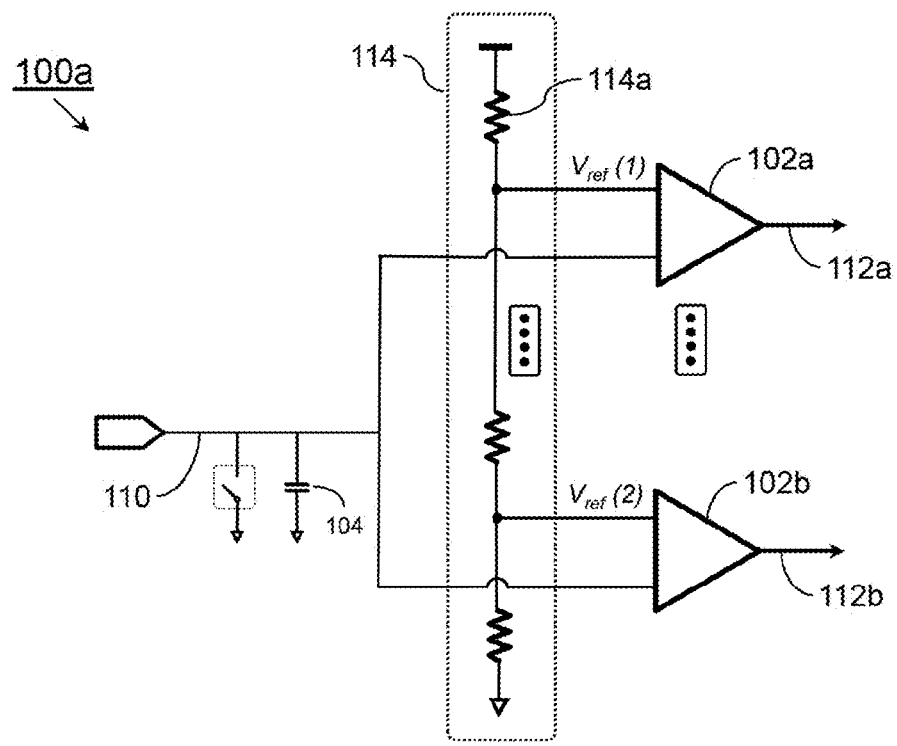
FIG. 2A illustrates a flash ADC implementation of the current-mode ADC architecture of FIG. 1.

Referring to FIG. 2A, an exemplary embodiment of a current-mode flash ADC architecture 100a may be implemented and may function similarly to the current-mode ADC architecture 100 of FIG. 1, except that the current-mode flash ADC architecture 100a may include a resistor array (114) of parallel resistors 114a connected to the input current 110. For example, the resistor array 114 may allow the target charge stored to the input capacitor 104 to be compared to multiple reference voltages $V_{ref}(1)$, $V_{ref}(2)$ by multiple comparators 102a, 102b, generating digital outputs 112a, 112b.

Figure 2B:
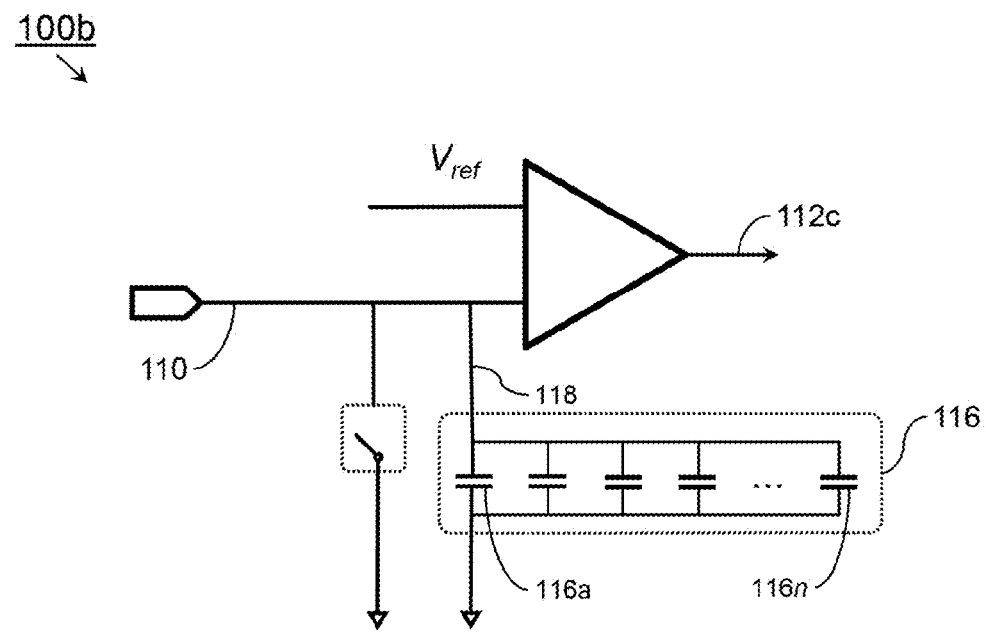
FIG. 2B illustrates a successive-approximation ADC implementation of the current-mode ADC architecture of FIG. 1.

Referring to FIG. 2B, an exemplary embodiment of a current-mode successive-approximation ADC architecture 100b (or successive-approximation-register (SAR)) may be implemented and may function similarly to the current-mode ADC architecture 100 of FIG. 1, except that the current-mode successive-approximation ADC architecture 100b may include, for example, a charge-redistribution array 116 of n capacitors 116a . . . 116n connected to the input current 110 by a common terminal (118) and configured to converge on an (n–1)-bit digital output 112c via binary search.

Figure 2C:
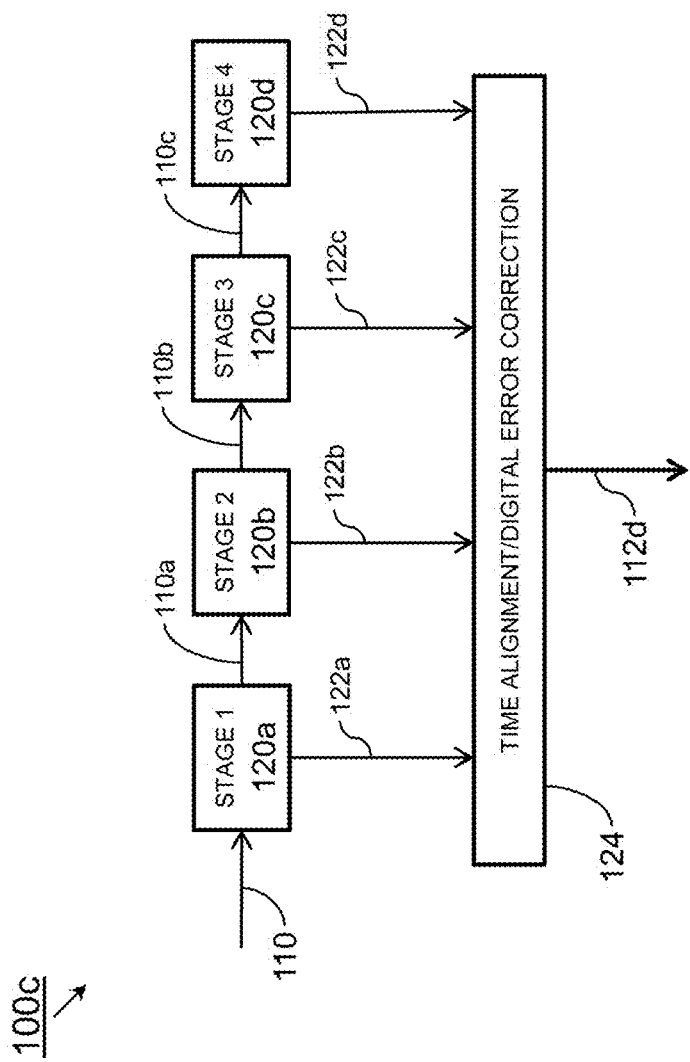
FIG. 2C illustrates a pipeline ADC implementation of the current-mode ADC architecture of FIG. 1.

Referring now to FIG. 2C, an exemplary embodiment of a current-mode pipeline ADC architecture 100c may be implemented and may function similarly to the current-mode ADC architecture 100 of FIG. 1, except that the current-mode pipeline ADC architecture 100c may incorporate multiple stages 120a-d. For example, the current-mode pipeline ADC architecture 100c may be a 16-bit ADC including 4 (four) 4-bit stages 120a-d. Each individual stage 120a-d may incorporate a 4-bit current-mode ADC architecture 100 (e.g., a 3-bit flash ADC implementation similar to the current-mode flash ADC architecture 100a shown by FIG. 2A). Each individual stage 120a-d may resolve 4 bits, passing the resulting digital output (122a-d) to shift registers and digital error correction logic (124). The resolved digital output may be subtracted from the input current 110, which is passed to subsequent stages (110a-c). The digital output 122a-d from each stage 120a-d may be time-aligned by the shift registers (124) into a 16-bit digital output 112d.

Figure 3A:
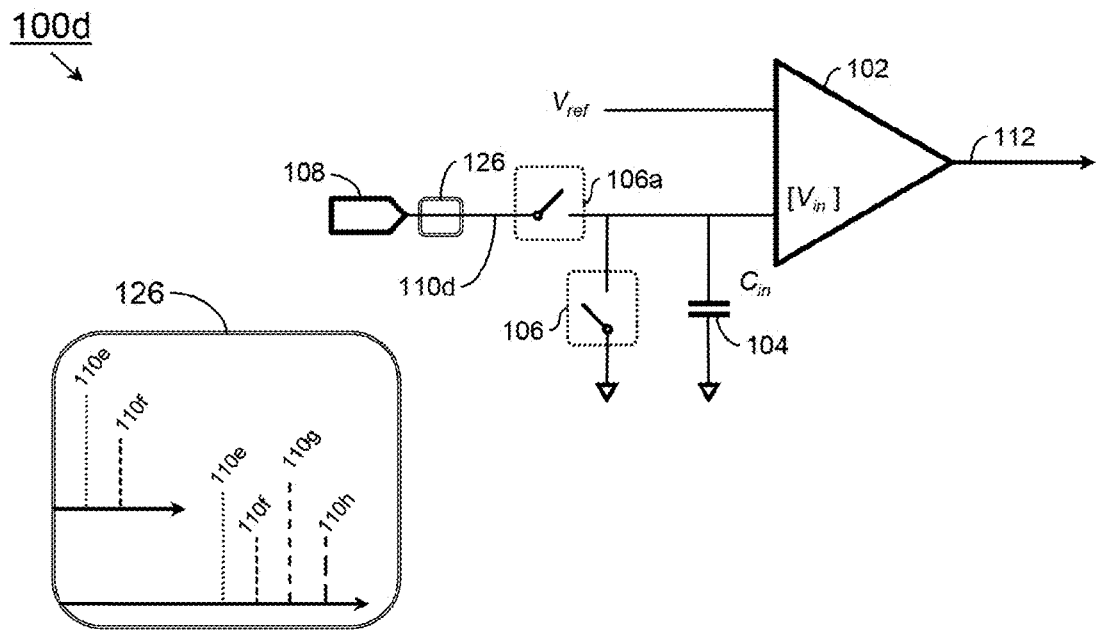
FIG. 3A illustrates an exemplary embodiment of a multichannel current-mode ADC architecture according to the inventive concepts disclosed herein.

Referring to FIG. 3A, an exemplary embodiment of a multichannel current-mode ADC architecture 100d may be implemented and may function similarly to the current-mode ADC architecture 100 of FIG. 1, except that the multichannel current-mode ADC architecture 100d may incorporate an interleaving switch 106a connecting the current source 108 to the input capacitor 102. The interleaving switch 106a may allow the multichannel current-mode ADC architecture 100d to sample and digitize an input signal 110d incorporating multiple component signals. For example, referring to the inset 126, the input signal 110d sampled by the multichannel current-mode ADC architecture 100d may be a photonic signal incorporating, at periodic intervals, two optical pulses (110e-f), four optical pulses (110e-h), or input from any number of optical pulse sources. The interleaving switch 106a may close to allow the multichannel current-mode ADC 100d to sample the optical pulse 110e. When the comparator 102 has generated digital output 112 by comparing the target charge (or the target voltage $V_{in}$ corresponding to the target charge) to the reference voltage $V_{ref}$, the interleaving switch 106a may open to prevent the comparator 102 from sampling the optical pulse 110f. The reset switch 106 may close to release the target charge on the input capacitor 104.

Figure 3B:
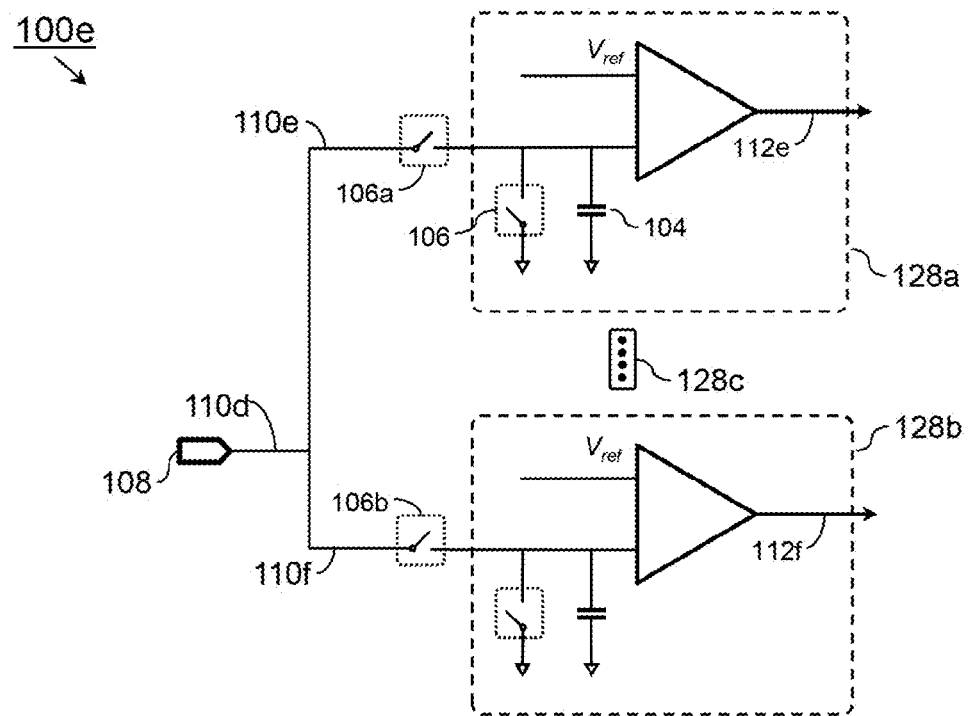
FIG. 3B illustrates an interleaved ADC implementation of the multichannel current-mode ADC architecture of FIG. 3A.

Referring to FIG. 3B, an exemplary embodiment of an interleaving current-mode ADC architecture 100e may be implemented and may function similarly to the multichannel current-mode ADC architecture 100d of FIG. 3A, except that the interleaving current-mode ADC architecture 100e may be configured to sample and digitize the interleaved input signal 110d via multiple current-mode ADC blocks 128*a-b*. Similarly to the multichannel current-mode ADC architecture of FIG. 3A, the interleaved input signal 110*d* may incorporate two, four, or any number of optical pulse sources, with one or more current-mode ADC blocks 128*a-b* dedicated to each optical pulse source. For example, the interleaving current-mode ADC architecture 100*e* may be implemented via a photonic receiver (disclosed in greater detail below) wherein the current source 108 may generate an interleaved input signal 110*d* incorporating two optical pulses 110*e-f*. Alternatively, the current source 108 may be a phase modulator embodied in a photonic receiver, the phase modulator configured to impart onto an optical pulse stream (or similar photonic input signal 110*d*) voltage information associated with multiple received input signals. For example, the interleaved input signal 110*d* may incorporate alternating pulse segments, a first set of pulse segments 110*e* including pulse information or voltage information associated with a first input signal and a second set of pulse segments 110*f* including pulse information or voltage information associated with a second input signal. The interleaving current-mode ADC architecture 100*e* may control sampling of the component parts of the interleaved input signal 110*d* via the interleaving switches 106*a*, 106*b*. For example, the interleaving switch 106*a* may be closed, and the interleaving switch 106*b* opened, to allow the current-mode ADC block 128*a* to sample and digitize the first set of pulse segments 110*e*, generating digital output 112*e*. When the pulse segment 110*e* has been digitized, the interleaving switch 106*a* may be opened, and the interleaving switch 106*b* may be closed, to allow the current-mode ADC block 128*b* to sample and digitize the second set of pulse segments 110*e*, generating digital output 112*f*; and the first current-mode ADC block 126*a* to release the first target charge on the input capacitor 104 via the reset switch 106. The interleaving current-mode ADC architecture 100*e* may include additional current-mode ADC blocks (128*c*) and interleaving switches (106*a-b*) for sampling and digitizing interleaved input signals 110*d* incorporating more than two optical pulse sources.

Figure 3C:
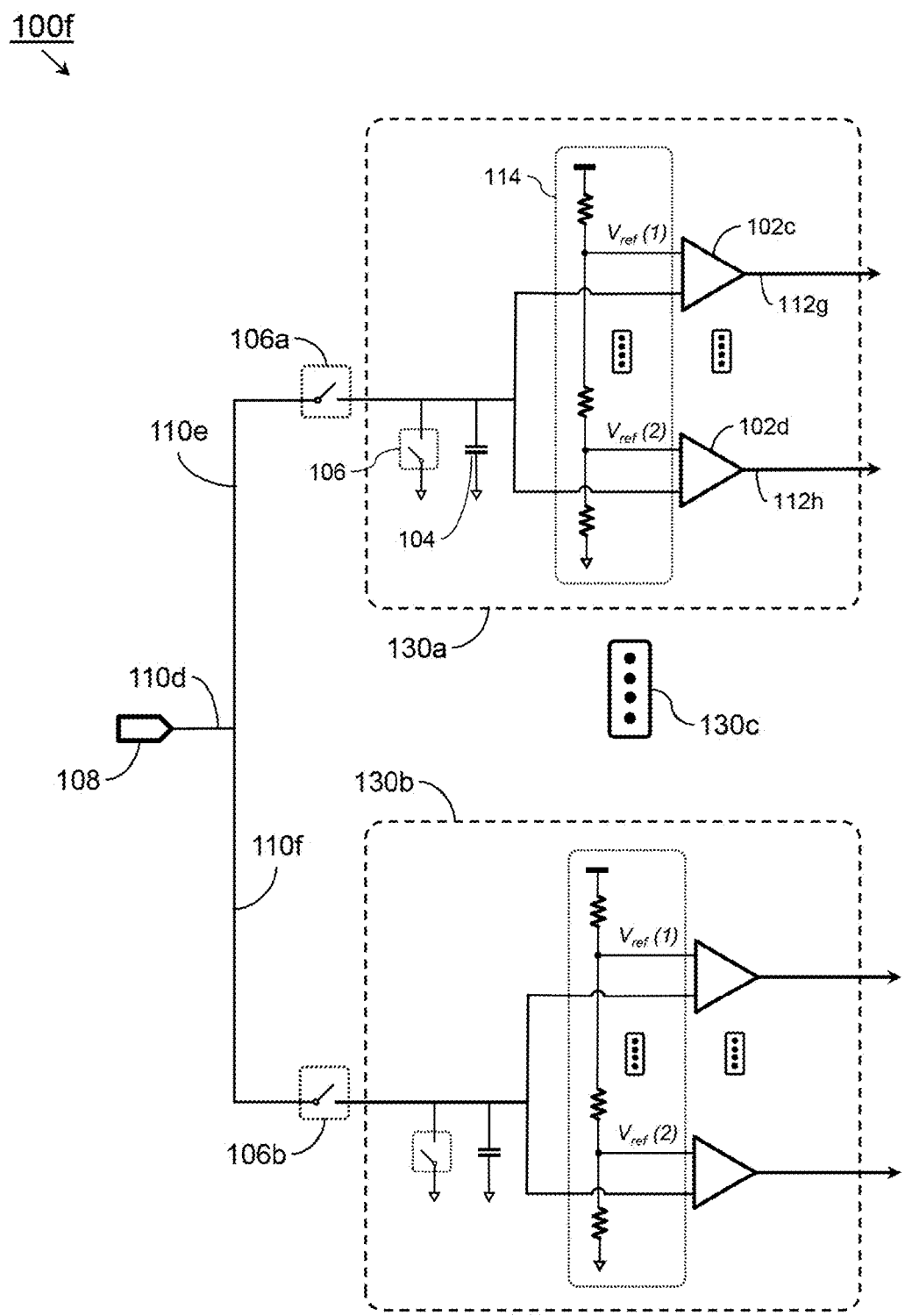
FIG. 3C illustrates a flash implementation of the multichannel current-mode ADC architecture of FIG. 3A.
Figure 3D:
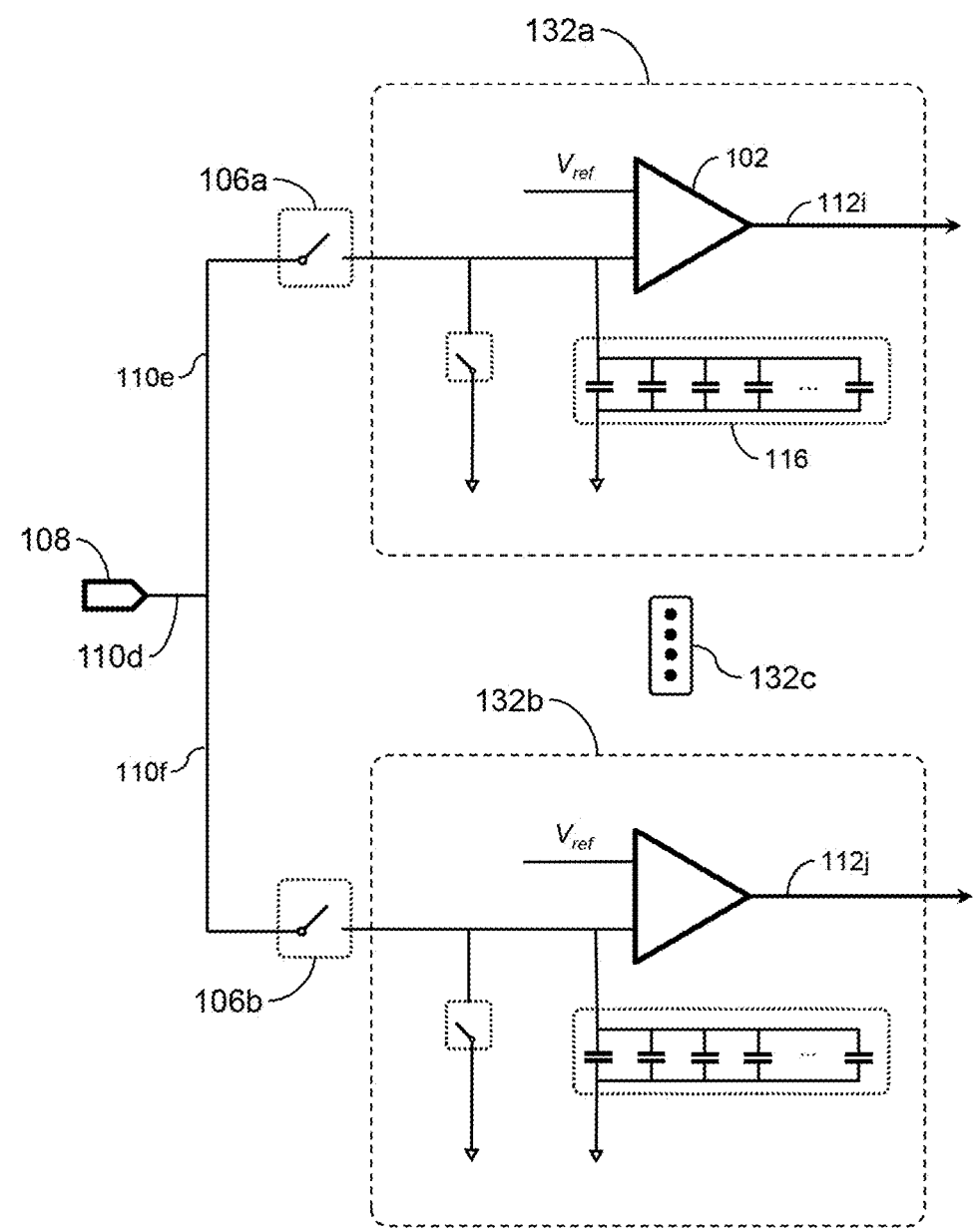
FIG. 3D illustrates a successive approximation implementation of the multichannel current-mode ADC architecture of FIG. 3A.

Referring to FIGS. 3C and 3D, the multichannel current-mode ADC architecture 100*d* (FIG. 3A) and interleaving current-mode ADC architecture 100*e* (FIG. 3B) may be adapted to flash, SAR, and pipeline implementations as shown by FIGS. 2A-C. Referring in particular to FIG. 3C, an exemplary embodiment of an interleaving current-mode flash ADC architecture 100*f* may incorporate multiple current-mode flash ADC blocks (130*a-c*) in conjunction with interleaving switches 106*a-b*. The current-mode flash ADC blocks 130*a-c* may be implemented and may function similarly to the current-mode flash ADC architecture 100*a* of FIG. 2A. For example, the interleaved input signal 110*d* may include optical pulse segments 110*e-f*. When the interleaved input signal 110*d* corresponds to an optical pulse segment 110*e*, the interleaving switch 106*a* may close, and the interleaving switch 106*b* may open, to allow the current-mode flash ADC block 130*a* to sample and digitize the optical pulse segment 110*e* (by comparing, via comparators 102*c-d*, the optical pulse segment 110*e* to one or more reference voltages via the resistor array 114), generating digital output 112*g-h*. When the interleaved input signal 110*d* corresponds to an optical pulse segment 110*f*, the interleaving switch 106*a* may open, and the interleaving switch 106*b* may close, to allow the current-mode flash ADC block 130*b* to sample and digitize the optical pulse segment 110*e* (and to allow the current-mode flash ADC block 130*a* to release the target charge on the input capacitor 104 via the reset switch 106. The interleaving current-mode flash ADC architecture 100*f* may include additional current-mode flash ADC blocks (130*c*) depending on the content (e.g., the number of incorporated pulses or signals) of the interleaved input signal 110*d*.

Referring in particular to FIG. 3D, an exemplary embodiment of an interleaved current-mode SAR ADC 100*g* may incorporate multiple current-mode SAR ADC blocks (132*a-c*) in conjunction with interleaving switches 106*a-b*. For example, when the interleaved input signal 110*d* corresponds to the optical pulse segment 110*e*, the interleaving switch 106*a* may close, and the interleaving switch 106*b* may open, to allow the current-mode SAR ADC block 132*a* to sample and digitize the optical pulse segment 110*e* (by comparing, via comparator 102 and capacitor array 116, one or more target charges based on the optical pulse segment 110*e* to a reference voltage, the results of the comparisons converging on a digital output 112*i*). When the interleaved input signal 110*d* corresponds to the optical pulse segment 110*f*, the interleaving switch 106*b* may close, and the interleaving switch 106*a* may open, to allow the current-mode SAR ADC block 132*b* to similarly sample and digitize the optical pulse segment 110*f*, generating the digital output 112*j*. The interleaved current-mode SAR ADC 100*g* may include additional current-mode SAR ADC blocks (132*c*) depending on the content of the interleaved input signal 110*d*.

Figure 4:
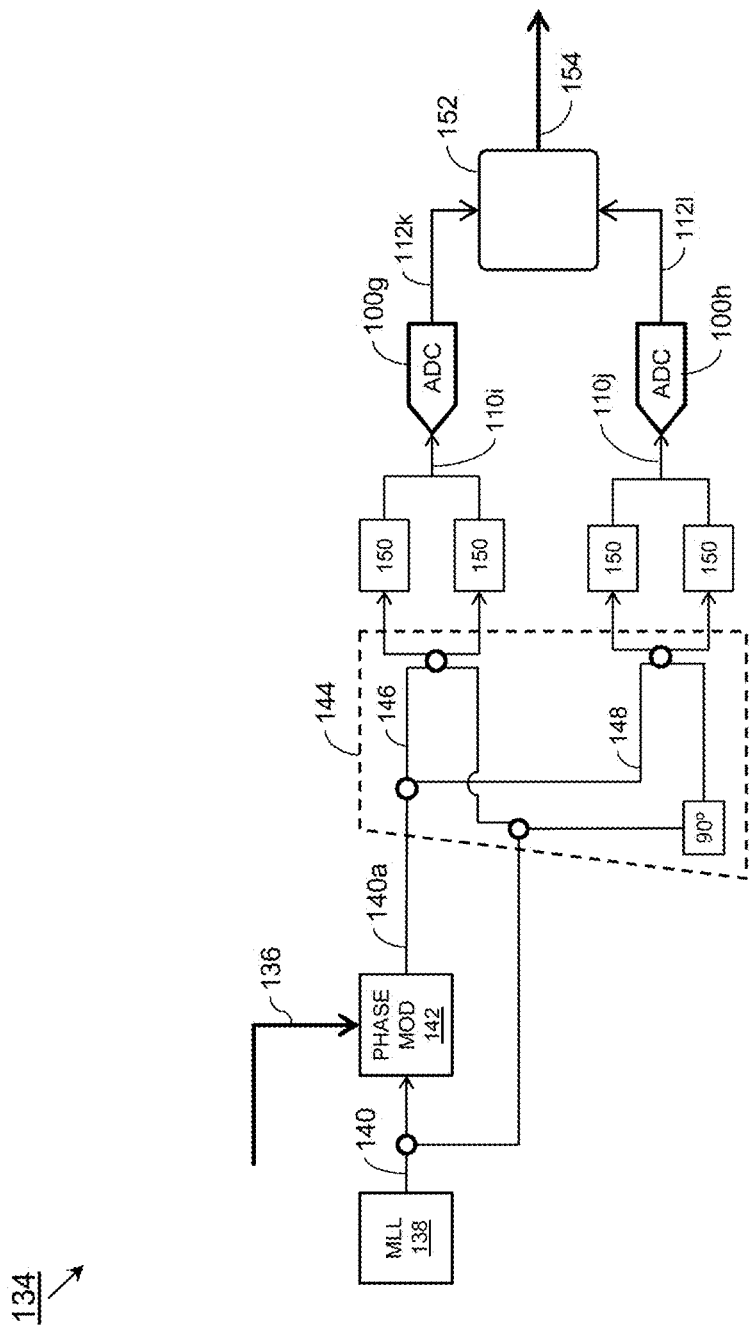
FIG. 4 illustrates an exemplary embodiment of a photonic receiver incorporating the current-mode ADC architecture of FIG. 1.

Referring to FIG. 4, current-mode ADC architectures 100*g*, 100*h* may be implemented and may function similarly to the current-mode ADC architecture 100 of FIG. 1 or the multichannel current-mode ADC architecture 100*d* of FIG. 3A, except that the current-mode ADC architectures 100*g*, 100*h* may be embodied in a receiver 134 (e.g., a photonic electronic intelligence (ELINT) receiver) configured to receive one or more analog input signal/s (136). A mode-locked laser (MLL) 138 or similar optical pulse source may generate an optical pulse stream (pulse train) modulated by a phase modulator 142 according to the received analog input signal. Quantizing circuitry of the receiver 134 may include a demodulator (144) for demodulating the resulting phase-modulated pulse stream (140*a*), e.g., into in-phase (146) and quadrature (148) components, or photonic I- and Q-signals respectively. The I-signal 146 and Q-signal 148 may be compared, via photodetectors (150), to the original pulse stream 140, and converted into current signals 110*i*, 110*j* received by the current-mode ADCs 100*g*, 100*h* respectively. The current-mode ADCs 100*g*, 100*h* may respectively digitize the current signals 110*i*, 110*j* into digital output 112*k*, 112*l*. The signal processors 152 of the receiver 134 may assemble the digital output 112*k*, 112*l* (corresponding respectively to signal constellation coordinates in the I and Q dimensions) into a recovered digital output signal 154.

Figure 5A:
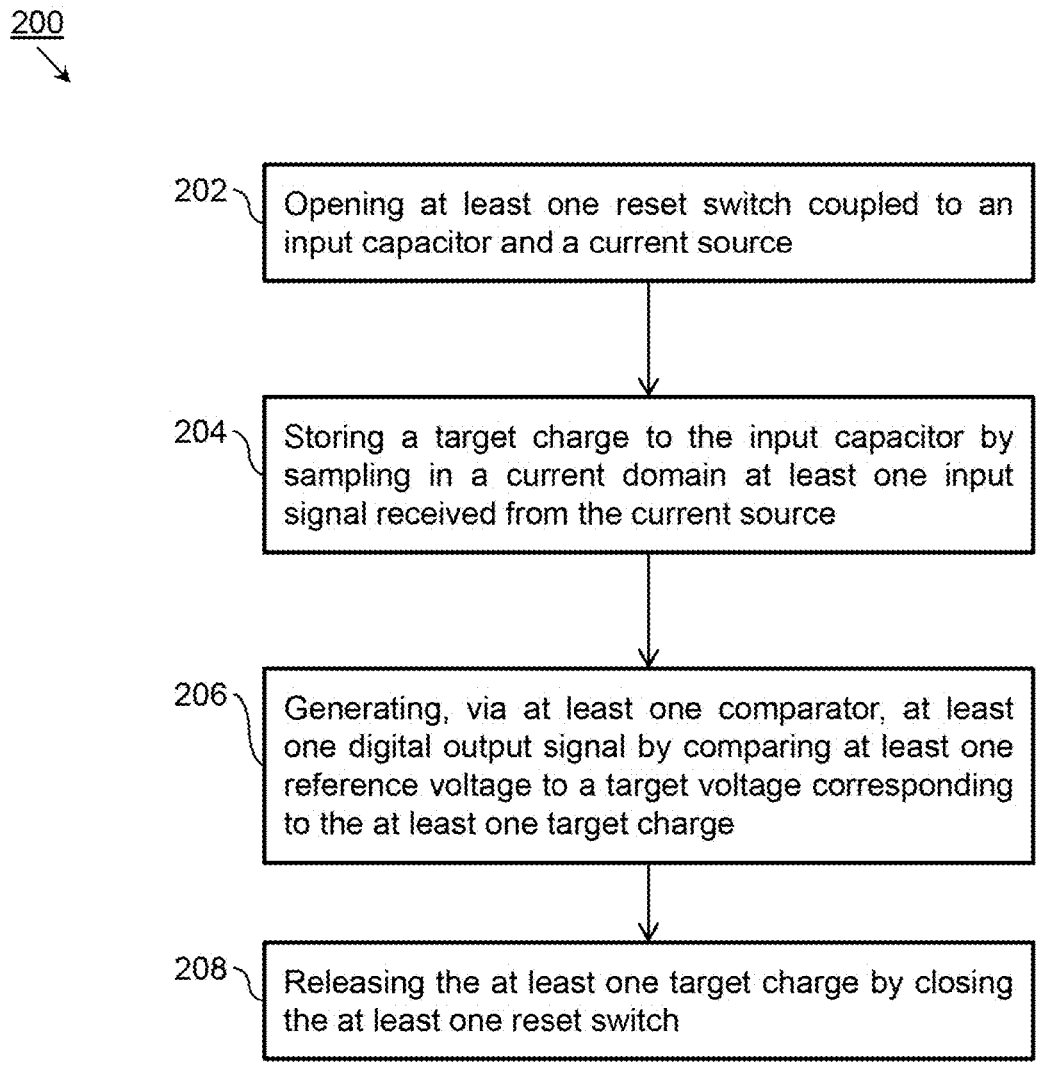
FIGS. 5A-5B illustrates an exemplary embodiment of a method for current-mode analog-digital conversion according to the inventive concepts disclosed herein.
Figure 5B:
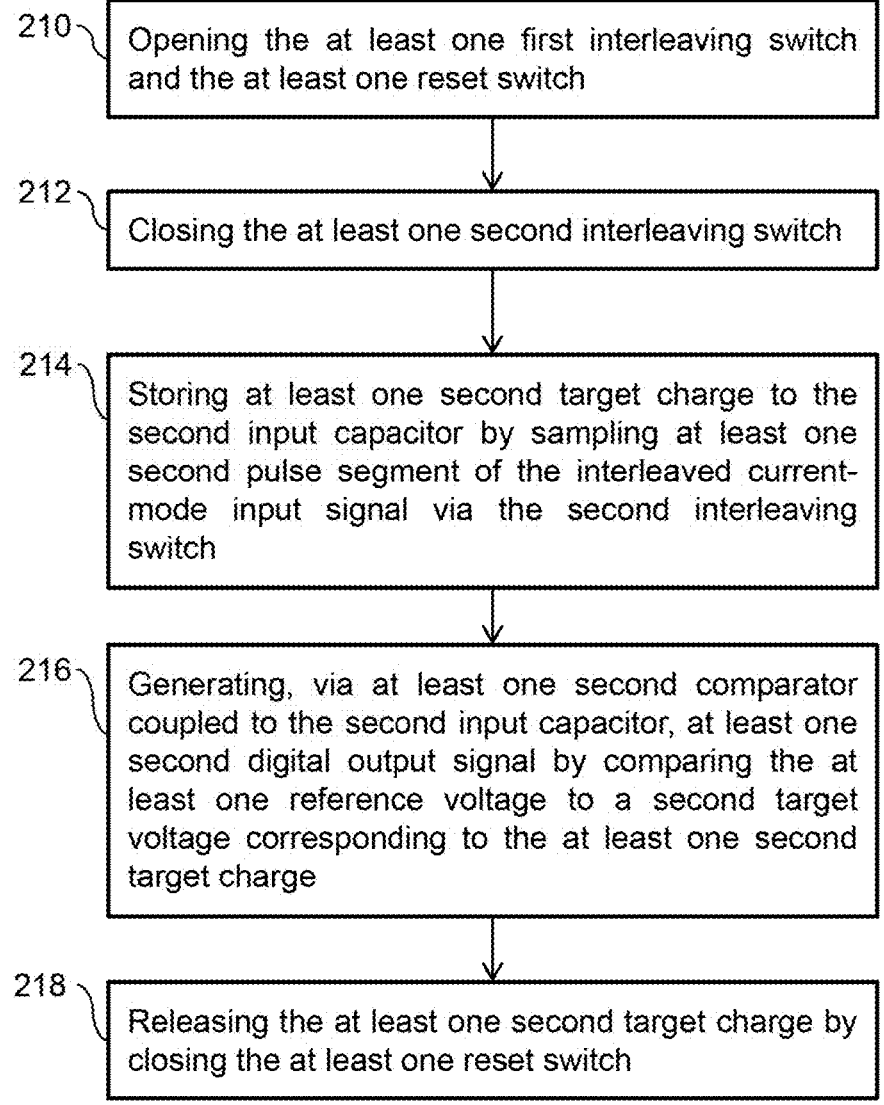

Referring now to FIGS. 5A-B, an exemplary embodiment of a method 200 for current-mode analog-digital conversion according to the inventive concepts disclosed herein may be implemented by the current-mode ADC architecture 100 or the multichannel current-mode architecture 100*d* in some embodiments, and may include one or more of the following steps.

Referring particularly to FIG. 5A, at a step 202, a reset switch of the current-mode ADC architecture opens to allow an input capacitor of the current-mode ADC architecture to store a charge.

At a step 204, the input capacitor stores a target charge by sampling in the current domain an input signal received from a current source. The sampled input signal may include a photonic signal (optical pulse train) or an interleaved input signal incorporating information associated with one or more received analog input signals or optical pulses. The input capacitor may sample the input signal via an interleaving switch which closes to connect the input capacitor to the current source. For example, an interleaving current-mode ADC architecture may incorporate multiple current-mode ADC blocks for sampling and digitizing incorporated pulse segments of the interleaved input signal. A first interleaving switch may close to allow a first capacitor of a first block to sample a first pulse segment while a second interleaving switch opens to prevent a second block (or any other additional blocks) from sampling the first pulse segment.

At a step 206, the comparator of the current-mode ADC architecture generates a digital output signal by comparing one or more reference voltages to a target voltage corresponding to the target charge on the input capacitor.

At a step 208, the reset switch closes, releasing the target charge on the input capacitor.

Referring particularly to FIG. 5B, the method 200 may include additional method steps 210 through 218. At the step 210, the first interleaving switch and the reset switches open. For example, when the first target charge on the first input capacitor has been digitized by the first comparator and released from the capacitor, the first interleaving switch may open to prevent the first ADC block from sampling pulse segments other than the first pulse segment, and the first reset switch may open to prepare the first input capacitor for sampling subsequent first pulse segments. In addition, a second reset switch of a second current-mode ADC block may open to prepare a second input capacitor of the second ADC block for sampling a second pulse segment of the interleaved current-mode input signal.

At a step 212, the second interleaving switch closes to allow the second input capacitor to sample the second pulse segment from the current source.

At a step 214, the second input capacitor stores a second target charge by sampling the second pulse segment via the second interleaving switch.

At a step 216, a second comparator of the second current-mode ADC block generates a second digital output by comparing the at least one reference voltage to a second target voltage corresponding to the second target charge on the second input capacitor.

At the step 218, the second reset switch closes to release the second target charge on the second input capacitor.

As will be appreciated from the above, systems and methods according to embodiments of the inventive concepts disclosed herein may improve both speed and performance of a receiver system incorporating the current-mode ADC, eliminating the need for current-to-voltage conversion and integrating seamlessly with photonic receiver applications. Input capacitance may be reduced (improving the achievable effective number of bits (ENOB)) without adversely affecting signal/noise ratio (SNR).

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A successive-approximation current-mode analog-digital converter (ADC), comprising:
    at least one input capacitor configured to store a target charge by sampling a current-mode input signal from a current source via an interleaving switch, the at least one input capacitor including an array of at least N capacitors coupled to the current source via a common terminal, where N is an integer;
    at least one comparator coupled to the at least one input capacitor, the at least one comparator configured to generate at least one N-bit digital output signal by comparing a target voltage to a reference voltage, the target voltage corresponding to the target charge; and
    at least one reset switch coupled to the current source, the reset switch configured to release the target charge.

2. The current-mode ADC of claim 1, wherein:
    the current-mode input signal includes at least one of a photonic signal and an optical pulse train; and
    the at least one comparator includes at least one photonic comparator.

3. The current-mode ADC of claim 1, wherein the at least one input capacitor or the at least one comparator is a component of at least one of a photonic receiver and an electronic intelligence (ELINT) receiver.

4. The current-mode ADC of claim 1, wherein:
    the ADC is a flash ADC further comprising a plurality of resistors coupled to the current source and to the at least one comparator; and
    the at least one comparator is configured to generate the at least one digital output signal by comparing the target voltage to one of a plurality of reference voltages.

5. The current-mode ADC of claim 1, wherein the ADC is a pipeline ADC comprising:
    a sequence of at least P Q-bit stages, where P and Q are integers, each stage configured to:
        receive the current-mode input signal from at least one of the current source and the preceding stage; and
        generate at least one Q-bit digital output based on the received current mode input signal;
    a plurality of shift registers coupled to the sequence of stages and configured to time-align the sequence of Q-bit digital outputs; and
    digital error-correction logic coupled to the plurality of shift registers and configured to generate at least one Q-bit digital output signal based on the sequence of time-aligned Q-bit digital outputs.

6. An interleaving current-mode ADC, comprising:
    at least one input capacitor configured to store a target charge by sampling a current-mode input signal via at least one interleaving switch coupled to a current source;
    at least one comparator coupled to the at least one input capacitor, the at least one comparator configured to generate at least one digital output signal by comparing a target voltage to a reference voltage, the target voltage corresponding to the target charge; and at least one reset switch coupled to the current source and to the interleaving switch, the reset switch configured to release the target charge.

7. The interleaving current-mode ADC of claim 6, wherein:
the current-mode input signal includes at least one of a photonic signal and an optical pulse train; and
the at least one comparator includes at least one photonic comparator.

8. The interleaving current-mode ADC of claim 6, wherein the at least one input capacitor or the at least one comparator is a component of at least one of a photonic receiver and an ELINT receiver.

9. The interleaving current-mode ADC of claim 6, wherein:
the ADC is a flash ADC further comprising a plurality of resistors coupled to the current source and to the at least one comparator; and
the at least one comparator is configured to generate the at least one digital output signal by comparing the target voltage to one of a plurality of reference voltages.

10. The interleaving current-mode ADC of claim 6, wherein:
the ADC is a successive-approximation ADC;
the at least one input capacitor includes an array of at least N capacitors coupled to the current source by a common terminal, where N is an integer; and
the at least one comparator is configured to generate an N-bit digital output signal.

11. The interleaving current-mode ADC of claim 6, wherein the ADC is a pipeline ADC comprising:
a sequence of at least P Q-bit stages, where P and Q are integers, each stage configured to:
receive the current-mode input signal from at least one of the current source and the preceding stage; and
generate at least one Q-bit digital output based on the received current mode input signal;
a plurality of shift registers coupled to the sequence of stages and configured to time-align the sequence of Q-bit digital outputs; and
digital error-correction logic coupled to the plurality of shift registers and configured to generate at least one Q-bit digital output signal based on the sequence of time-aligned Q-bit digital outputs.

12. The interleaving current-mode ADC of claim 6, wherein:
the current-mode input signal includes a first input segment and at least one second input segment;
the at least one interleaving switch includes at least one of a first interleaving switch and a second interleaving switch;
the at least one input capacitor comprises:
at least one first input capacitor configured to store a first target charge by sampling the first input segment via the at least one first interleaving switch; and
at least one second input capacitor configured to store a second target charge by sampling the at least one second input segment via the at least one second interleaving switch; and
the at least one comparator comprises:
at least one first comparator configured to generate a first digital output signal by comparing a first target voltage to the reference voltage, the first target voltage corresponding to the first target charge; and at least one second comparator configured to generate a second digital output signal by comparing at least one second target voltage to the reference voltage, the second target voltage corresponding to the at least one second target charge.

13. The interleaving current-mode ADC of claim 12, wherein:
the at least one first interleaving switch is configured to prevent the at least one first input capacitor from sampling the at least one second input segment by opening; and
the at least one second interleaving switch is configured to prevent the at least one second input capacitor from sampling the first input segment by opening.

14. A method for current-mode analog-digital conversion, the method comprising:
closing at least one interleaving switch coupled to a current source and an input capacitor;
opening at least one reset switch coupled to the input capacitor and the current source;
storing at least one target charge to the input capacitor by sampling in a current domain at least one input signal received from the current source via the at least one interleaving switch;
generating, via at least one comparator, at least one digital output signal by comparing at least one reference voltage to a target voltage corresponding to the at least one target charge; and
releasing the at least one target charge by closing the at least one reset switch.

15. The method of claim 14, wherein the at least one input signal received from the current source includes
at least one photonic signal.

16. The method of claim 14, wherein storing at least one target charge to the input capacitor by sampling in a current domain at least one input signal received from the current source includes:
opening the at least one interleaving switch coupled to the current source and the input capacitor to separate sampling of individual segments, components, sources, or channels of a segmented, a pulse train, a multisource, or a multichannel input signal.

17. The method of claim 16, wherein:
opening the at least one interleaving switch coupled to the current source and the input capacitor to separate sampling of individual segments, components, sources, or channels of a segmented, a pulse train, a multisource, or a multichannel input signal includes opening a first interleaving switch coupled to the current source and a first input capacitor and closing a second interleaving switch coupled to the current source and a second input capacitor.

18. The method of claim 14, wherein:
closing at least one interleaving switch coupled to a current source and an input capacitor includes closing at least one first interleaving switch coupled to a first input capacitor and opening at least one second interleaving switch coupled to a second input capacitor; and
storing at least one target charge to the input capacitor by sampling in a current domain at least one input signal received from the current source via the interleaving switch includes storing at least one first target charge to the first input capacitor by sampling at least one first pulse segment of an interleaved current-mode input signal via the first interleaving switch.

19. The method of claim 14, wherein the at least one interleaving switch includes at least one first interleaving switch and at least one second interleaving switch, the method further comprising:
- opening the at least one first interleaving switch and the at least one reset switch, the at least one reset switch comprising a first reset switch;
- closing the at least one second interleaving switch;
- storing at least one second target charge to the second input capacitor by sampling at least one second pulse segment of the interleaved current-mode input signal via the at least one second interleaving switch;
- generating, via at least one second comparator coupled to the second input capacitor, at least one second digital output signal by comparing the at least one reference voltage to a second target voltage corresponding to the at least one second target charge; and
- releasing the at least one second target charge by closing a second reset switch.

20. A pipeline current-mode analog-digital converter (ADC), comprising:
- at least one input capacitor configured to store a target charge by sampling a current-mode input signal from a current source via an interleaving switch;
- at least one comparator coupled to the at least one input capacitor, the at least one comparator configured to generate at least one digital output signal by comparing a target voltage to a reference voltage, the target voltage corresponding to the target charge;
- at least one reset switch coupled to the current source, the reset switch configured to release the target charge;
- a sequence of at least P Q-bit stages, where P and Q are integers, each stage configured to:
  - receive the current-mode input signal from at least one of the current source and the preceding stage; and
  - generate at least one Q-bit digital output based on the received current mode input signal;
- a plurality of shift registers coupled to the sequence of stages and configured to time-align the sequence of Q-bit digital outputs; and
- digital error-correction logic coupled to the plurality of shift registers and configured to generate at least one Q-bit digital output signal based on the sequence of time-aligned Q-bit digital outputs.

* * * * *